(12) United States Patent
Qiao et al.

(10) Patent No.: US 6,803,318 B1
(45) Date of Patent: Oct. 12, 2004

(54) METHOD OF FORMING SELF ALIGNED CONTACTS

(75) Inventors: Jianmin Qiao, Fremont, CA (US); Sam Geha, Sunnyvale, CA (US); Mehran G. Sedigh, Los Angeles, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/661,666

(22) Filed: Sep. 14, 2000

(51) Int. Cl.$^7$ .............................................. H01L 21/24
(52) U.S. Cl. ...................................... 438/700; 438/735
(58) Field of Search ................................ 438/700, 701, 438/734, 735, 743, 744, 737, 738

(56) References Cited

U.S. PATENT DOCUMENTS

| | | | | |
|---|---|---|---|---|
| 5,314,575 A | * | 5/1994 | Yanagida ..................... | 216/67 |
| 5,523,258 A | | 6/1996 | Petti et al. ................... | 437/186 |
| 5,562,801 A | * | 10/1996 | Nulty ....................... | 156/643.1 |
| 5,631,179 A | * | 5/1997 | Sung .......................... | 438/264 |
| 5,710,061 A | | 1/1998 | Cleeves ....................... | 257/510 |
| 5,728,619 A | * | 3/1998 | Tsai et al. ................... | 438/297 |
| 5,783,496 A | * | 7/1998 | Flanner ....................... | 438/743 |
| 5,861,676 A | | 1/1999 | Yen ............................ | 257/776 |
| 6,025,255 A | * | 2/2000 | Chen et al. .................. | 438/595 |
| 6,066,555 A | | 5/2000 | Nulty et al. .................. | 438/634 |
| 6,074,959 A | * | 6/2000 | Wang et al. .................. | 438/738 |
| 6,080,661 A | * | 6/2000 | Bothra ........................ | 438/233 |
| 6,091,129 A | | 7/2000 | Cleeves ....................... | 437/195 |
| 6,117,791 A | * | 9/2000 | Ko et al. ..................... | 438/723 |
| 6,183,655 B1 | * | 2/2001 | Wang et al. .................. | 216/68 |
| 6,184,147 B1 | * | 2/2001 | Yang et al. .................. | 438/714 |
| 6,258,729 B1 | * | 7/2001 | DeBoer et al. ............... | 468/745 |
| 6,274,481 B1 | * | 8/2001 | Yang et al. .................. | 438/634 |
| 6,277,720 B1 | * | 8/2001 | Doshi ......................... | 438/586 |
| 6,337,285 B1 | * | 1/2002 | Ko ............................ | 216/67 |

FOREIGN PATENT DOCUMENTS

JP    1-238147    *   9/1989

* cited by examiner

*Primary Examiner*—Chandra Chaudhari
*Assistant Examiner*—Thanhha Pham
(74) *Attorney, Agent, or Firm*—Kevin I. Daffer; Conley Rose P.C.

(57) ABSTRACT

A method is provided for forming a self aligned contact by etching an opening through a low doped or undoped dielectric layer such as phosphosilicate glass. The dielectric layer may be formed on a semiconductor layer which may include regions of monocrystalline silicon and undoped silicon dioxide. A first portion of a dielectric layer may be etched with a first etch chemistry, and a second portion of the dielectric layer may be etched with a second etch chemistry. The first etch chemistry may be substantially different than the second etch chemistry. In this manner, the first etch chemistry may have a substantially different etch selectivity than the second etch chemistry. For example, in an embodiment, the first etch chemistry may be selective to silicon nitride, and the second etch chemistry may be selective to undoped silicon oxide. Therefore, by using multiple etch chemistries to etch a single dielectric layer, a self aligned contact having optimized properties such as sidewall angle, aspect ratio, and critical dimension may be formed while an etch stop liner layer such as a silicon nitride layer may be eliminated.

16 Claims, 6 Drawing Sheets

METHOD OF FORMING SELF ALIGNED CONTACTS

BACKGROUND OF THE INVENTION

1. Field of the Invention

This invention relates to semiconductor device manufacturing, and more particularly, to improved methods for etching openings in insulating layers and a semiconductor device with well defined contact openings.

2. Description of the Related Art

The following descriptions and examples are not admitted to be prior art by virtue of their inclusion within this section.

In the fabrication of semiconductor devices, numerous conductive device regions such as transistors and layers of devices may be formed in or on a semiconductor substrate. For example, a typical metal oxide semiconductor (MOS) transistor such as a NMOS or PMOS transistor generally includes source/drain regions in a substrate, and a gate electrode formed above the substrate between the source/drain regions and separated from the substrate by a relatively thin dielectric. Conductive regions and layers of the device may be isolated from one another by a dielectric. Examples of dielectrics may include silicon dioxide ($SiO_2$), tetraorthosilicate glass (TEOS), silicon nitride ($Si_xN_y$), silicon oxynitride ($SiO_xN_y(H_2)$), and silicon dioxide/silicon nitride/silicon dioxide (ONO) The dielectrics may be grown or may be deposited by physical deposition such as sputtering or by a variety of chemical deposition methods and chemistries such as chemical vapor deposition. Additionally, the dielectrics may be undoped or may be doped, for example with boron, phosphorus, boron and phosphorus, or fluorine, to form a doped dielectric layer such as borophosphosilicate glass (BPSG), phosphosilicate glass (PSG), and fluorinated silicate glass (FSG).

At various stages in the fabrication of semiconductor devices, it may be necessary to form openings in a dielectric layer to allow for contact to underlying regions or layers. Generally, an opening through a dielectric exposing a diffusion region or an opening through a dielectric layer between polysilicon and a first metal layer is called a "contact opening" or a "contact hole." An opening in other dielectric layers such as an opening through an intermetal dielectric layer is referred to as a "via." For purposes of this disclosure, henceforth "contact opening" may be used to refer to a contact opening and/or a via. A contact opening may expose a diffusion region within the silicon substrate such as a source or drain, or may expose some other layer or structure such as an underlying metallization layer, a local interconnect layer, or a gate structure. Conductive contact structures may be formed above the source/drain regions, and interconnects may overlie the contact structures and may connect neighboring contact structures. These contact structures to diffusion regions may be isolated from an adjacent gate structure by a dielectric spacer or dielectric shoulder portions. The dielectric spacer or dielectric shoulder portions may also isolate the gate from the diffusion region.

There are, however, disadvantages associated with typical conductive contact structures. For example, conductive contact structures may be aligned to the underlying regions or layers with a masking step such as a lithography process. Therefore, extra area may be allocated to prevent misalignment of the contact structure to the underlying regions or layers. Proper alignment is necessary to avoid shorting the contact structure to other underlying structures such as a gate or a diffusion well surrounding a diffusion region having an overlying contact structure. As such, typical contact structures may limit any reduction in area of the underlying regions or layers such as diffusion regions. In this manner, larger contact areas may limit the density of elements which may be formed on a semiconductor device. Larger contact areas may also be responsible for increased diffusion-to-substrate junction capacitance, which may limit the speed of a semiconductor device.

A self aligned contact structure may eliminate alignment problems associated with typical contact structures and may increase the device density of a structure. A self aligned contact structure may be a contact to a source or drain diffusion region. A self aligned contact structure may be useful in compact semiconductor device geometries because the self aligned contact structure may overlap a conducting area such as a gate structure to which it is not supposed to make electric contact and the edge of a diffusion region without shorting out to the well beneath. Consequently, less contact area may be needed and gates or conductive material lines such as polysilicon lines may be moved closer together. As such, more gates or lines may be formed on a given substrate than with typical contact structures.

As the device densities of semiconductor devices are continually being increased, profile and dimension requirements of semiconductor device features such as self aligned contact structures must be further optimized. For example, typically it is desirable for a contact opening to have sidewalls which are substantially perpendicular to an upper surface of a semiconductor substrate. As such, the sidewall angle of the contact opening may be at a 90° angle with respect to the upper surface of the semiconductor substrate such that lateral dimensions of the contact opening may be substantially uniform across the height of the contact opening. In this manner, a contact structure may be formed in the contact opening which may have predictable and desirable dimensions and electrical properties. In addition, the lateral dimensions of semiconductor features such as self aligned contact structures are continually being reduced in order to increase the device density on a semiconductor substrate. Generally, however, the height of semiconductor features may not be reduced in proportion to the lateral dimensions. In this manner, the aspect ratio of semiconductor features such as contact structures may be higher for advanced semiconductor devices which may be designed to have high device densities. An aspect ratio as used herein generally describes the ratio between the height and width of a semiconductor feature such as a contact structure when viewed in cross section. As the aspect ratio of a contact structure increases, it may become increasingly difficult to form the contact opening. For example, if the sidewall angle of the contact opening deviates substantially from 90°, the lateral dimensions of the contact opening at the top of the contact opening may be larger than an acceptable critical dimension before the entire contact opening may be formed.

To form such a self aligned contact opening a patterned layer of photoresist may be formed over the dielectric layer having openings corresponding to regions of the dielectric layer where contact openings are to be formed in the dielectric layer. In most modern processes, a dry etch may then be performed in which the wafer may be exposed to a plasma. The plasma may be formed by flowing one or more gases such as one or more halocarbons and/or one or more other halogenated compounds such as $CF_4$, $CHF_3$ (Freon 23), $SF_6$, and $NF_3$. In addition, gases such as $O_2$, Ar, and $N_2$ may also be added to the gas flow. After the opening has been formed thereby exposing a portion of the region or layer to be contacted, the opening may be cleaned with a sputter etch such as a radio-frequency sputter etch. The sputter etch may be used to remove small amounts of material which may form on sidewalls or a bottom surface of the contact opening during dry etching of the contact opening. The opening may then be filled with a conductive material which may be deposited in the opening and in electrical contact with the underlying region or layer. The conductive material may be planarized such that an upper surface of the conductive material is substantially coplanar with an upper surface of the dielectric layer thereby forming a self aligned contact structure.

There are, however, several disadvantages to conventional methods for forming self aligned contact structures. For example, typically a contact opening may be etched through a dielectric layer to a diffusion region which may be formed in a semiconductor layer. The semiconductor layer may include regions of silicon such as monocrystalline silicon and isolation regions such as undoped silicon dioxide. To etch the contact opening without destroying the isolation regions, an etch chemistry may be used which may be selective to undoped silicon dioxide. Such an etch chemistry may have a slow etch rate with respect to lightly doped or undoped dielectric materials such as silicon dioxide and a fast etch rate with respect to materials which have substantially different properties than lightly doped or undoped dielectric materials. Examples of materials which may have a different etch response than lightly doped or undoped dielectric materials may include heavily doped dielectric materials such as heavily doped BPSG and heavily doped PSG. For example, a heavily doped BPSG dielectric material may have a boron concentration of approximately 5% or more by weight, and a heavily doped PSG dielectric material may have a phosphorus concentration of approximately 6% or more by weight. Additional examples of materials which may have a different etch response than lightly doped or undoped dielectric materials may include silicon nitride or other dielectric materials which have a substantially different composition than lightly doped or undoped silicon dioxide. Therefore, a contact opening may be formed through a heavily doped dielectric layer or silicon nitride stopping on a semiconductor layer which may include field oxide regions without destroying the field oxide regions.

There can be disadvantages, however, to using a heavily doped dielectric layer in a semiconductor device. For example, BPSG materials having a boron concentration of approximately 5% or more by weight may be very hygroscopic (attract water) and unstable. The hygroscopic nature of high concentration BPSG may create bubbles in the dielectric material and may form one or more phosphorus-based acids which may corrode conductive lines such as aluminum interconnects. In addition, unstable BPSG may crack and/or form boron rich crystals. BPSG cracks may ruin the insulating properties of BPSG, and boron rich crystals may result in non-planar surfaces and/or micro-masking etch defects. In addition, due to the doping of the BPSG material, dopant in the dielectric layer may be an unwanted diffusion source to underlying silicon. For example, BPSG may primarily be a source of phosphorus, and phosphorus outdiffusion may increase as the boron concentration increases. In a similar manner, PSG may also become increasingly hygroscopic and unstable at high phosphorus levels.

A lightly doped or undoped dielectric layer may be used in place of a heavily doped dielectric layer to avoid the problems described above. An etch chemistry which may have an appropriate etch rate for a lightly doped or undoped dielectric layer may be used to form a contact opening in such a dielectric layer. Such an etch chemistry, however, may not be selective to isolation regions which may be formed in an underlying semiconductor layer. Therefore, to prevent removal of the isolation regions, an appropriate etch stop layer may be formed between the lightly doped or undoped dielectric layer and the semiconductor layer. Appropriate etch stop layer materials may include silicon oxynitride and silicon nitride. As such, appropriate etch stop layers may have a substantially different etch response to an etch chemistry than lightly doped or undoped dielectric layers. Removal of the etch stop layer, however, is necessary such that an electrical contact between the contact structure and the semiconductor layer may be formed. After etching the contact opening through the lightly doped or undoped dielectric layer, therefore, a second etch process may be performed to remove the etch stop layer.

There are, however, several disadvantages to using such an etch stop layer for forming a self aligned contact structure. For example, using an etch stop layer increases the number of steps in a manufacturing process. As such, the complexity of the overall manufacturing process may be increased, making fabrication of a semiconductor device more difficult to accomplish. In addition, process yield may also be decreased because addition of one or more process steps may result in more chances for forming defects in the semiconductor device. Furthermore, the semiconductor device fabrication may require a longer time period due to the additional process steps. In this manner, overall cost of fabricating a semiconductor device may increase, and manufacturing capacity may be decreased.

Another disadvantage to increasing the number of steps in a manufacturing process may be that the semiconductor device may be subjected to an increased number of temperature cycles during processing and/or an increased amount of time at elevated temperatures. For example, deposition of an etch stop layer as described above may require additional high-temperature processes. An increased number of temperature cycles may undesirably alter the properties of structures formed within semiconductor devices. For example, if a MOS field effect transistor (MOSFET) exceeds a certain number of temperature cycles during processing, the threshold voltage, $V_t$, of such transistors may shift undesirably. In addition, the reliability of such transistors may also be adversely affected as junctions may be more susceptible to failure mechanisms such as junction breakdown or "punch-through" current. In another example, for a semiconductor device which includes metal contacts to a doped semiconductor substrate, increasing the number of temperature cycles may result in higher contact resistance due to segregation of dopants at the metal-semiconductor substrate interface and/or increased oxidation of the metal. In a further example, for a semiconductor device which includes a substrate having diffusion regions formed with implanted dopants, increasing the number of temperature cycles may result in increased diffusion region dimensions due to out-diffusion of dopants. As such, increasing the number of temperatures cycles may produce less robust devices, increased contact resistance, and may prevent formation of smaller device features.

Accordingly, it would be advantageous to develop a method for forming a self aligned contact structure having substantially perpendicular sidewalls, a high aspect ratio, and a minimum critical dimension in a lightly doped or undoped dielectric layer without using an etch stop layer to protect isolation regions in an underlying semiconductor layer.

SUMMARY OF THE INVENTION

The problems outlined above may be in large part addressed by a method for forming a self aligned contact by etching an opening through a low doped or undoped dielectric layer. That is, a method is provided in which a first portion of a dielectric layer may be etched with a first etch chemistry and a second portion of the dielectric layer may be etched with a second etch chemistry. In an embodiment, an appropriate dielectric layer may be a doped silicon oxide material such as phosphosilicate glass (PSG) having a phosphorus concentration of less than approximately 6 wt. % which may be formed in a single processing step such as a single deposition process. As such, the dielectric layer may be substantially continuous such that an interface does not exist between the first portion of the dielectric layer and the second portion of the dielectric layer. A thickness of the first portion of the dielectric layer may be greater than a thickness of the second portion of the dielectric layer. In addition, the thickness of the second portion of the dielectric layer may be greater than approximately one half of a height of an adjacent gate structure. The first etch chemistry may be substantially different than the second etch chemistry. For example, in an embodiment, the first etch chemistry may be selective to silicon nitride, and the second etch chemistry may be selective to lightly doped or undoped silicon oxide. Therefore, by using multiple etch chemistries to etch a single dielectric layer, a self aligned contact structure having optimized properties such as sidewall angle, aspect ratio, and critical dimension may be formed while formation of an etch stop liner layer such as a silicon nitride layer may be eliminated.

According to an embodiment, a gate structure may be formed upon a semiconductor layer. The semiconductor layer may be a semiconductor substrate such as a monocrystalline silicon semiconductor substrate. Alternatively, the semiconductor layer may include various semiconductor structures on another level of a semiconductor device. The semiconductor layer may also include an isolation region which may be formed in the semiconductor layer. A gate dielectric layer such as silicon dioxide may be formed upon the semiconductor layer. A layer of conductive material such as polysilicon may be formed upon the gate dielectric layer. In addition, a top insulating layer such as silicon oxynitride or silicon nitride may be formed upon the conductive material layer. A layer of photoresist material may then be formed upon the top insulating layer and patterned such that portions of the top insulating layer may be exposed. As such, exposed portions of the top insulating layer, the gate conductive material layer, and the gate dielectric layer may be successively removed by an etch process to form gate conductor stacks. The photoresist material may be also be stripped following the formation of the gate conductor stacks. A dielectric layer, such as silicon dioxide, silicon nitride, or silicon oxynitride, may be formed on the gate conductor stacks and the semiconductor substrate. The dielectric layer may then be subjected to an anisotropic etch process in which dielectric sidewall spacers are formed laterally adjacent sidewall surfaces of the gate conductor stacks thereby forming gate structures. In this manner, any number of gate structures may be formed on and laterally spaced across a semiconductor layer.

In an embodiment, a layer of dielectric material may then be formed upon and in contact with the gate structures and the semiconductor substrate. Appropriate dielectric materials may include low doped PSG, low doped borophosphosilicate glass (BPSG), and undoped silicon dioxide. The dielectric layer may be deposited in a single deposition process, such as a chemical vapor deposition (CVD) process. In this manner, although properties of the dielectric layer may vary slightly throughout the layer due to variations in processing conditions, the composition of the dielectric layer and other chemical and physical properties may be substantially uniform throughout the dielectric layer. As such, the dielectric layer may be substantially continuous such that an interface does not exist between the first and second portions of the dielectric layer. The dielectric layer may then be planarized to a level spaced above the gate structures.

In an embodiment, a hard mask layer may be formed on the dielectric layer. For example, if the dielectric layer is low doped PSG or BPSG, the hard mask layer may be a cap layer of an undoped dielectric material such as silicon dioxide. A layer of photoresist may be formed on the hard mask layer and patterned to expose regions of the hard mask layer. Exposed regions of the hard mask layer may then be removed to expose regions of the dielectric layer. The layer of photoresist may then be removed. Alternatively, the layer of photoresist may remain on the hard mask layer during subsequent etch processes. In an additional embodiment, the formation of a hard mask layer may be eliminated, and a layer of photoresist may be formed on the dielectric layer. The photoresist may then be patterned to expose regions of the dielectric layer. In further embodiments, the hard mask layer, the photoresist layer, and the combination of the hard mask layer and the layer of photoresist may be generically referred to as an etch mask layer.

In an embodiment, a first portion of the dielectric layer may be etched with a first etch chemistry in regions of the dielectric layer which have been exposed by patterning the etch mask layer. Etching the first portion of the dielectric layer may involve removing the dielectric layer to a level which may be approximately coplanar with an upper surface of the gate structures. As such, etching the first portion of the dielectric layer may include exposing an upper corner of the gate structures. An upper corner of the gate structures may include an upper corner of the dielectric sidewall spacers and a portion of the top insulating layer of the gate structures. Etching the first portion of the dielectric layer may be a timed process because etching the first portion of the dielectric layer may not involve removing the entire dielectric layer such that an endpoint may not be detected. In this manner, a second portion of the dielectric material may remain after etching the first portion of the dielectric layer. A thickness of the first portion of the dielectric layer may be greater than a thickness of the second portion of the dielectric layer.

In an embodiment, a second portion of the dielectric layer may be etched with a second etch chemistry. The second portion of the dielectric layer may include the dielectric layer which may remain after etching the first portion of the dielectric layer. For example, a thickness of the second portion of the dielectric layer may be greater than approximately one half of a height of the gate structures and less than approximately the height of the gate structures. As such, etching the second portion of the dielectric layer. may involve removing the dielectric layer from a level which may be approximately coplanar with the upper surface of the gate structures to a level which may be commensurate with an upper surface of the semiconductor layer. Etching the second portion of the dielectric layer may be a timed process based on experimental data. Alternatively, etching the second portion of the dielectric layer may involve stopping the etch process after an endpoint has been detected because etching the second portion of the dielectric layer may involve removing the dielectric layer to the semiconductor layer. In this manner, an etched structure may be formed from an upper surface of the dielectric layer to an upper surface of the semiconductor layer which may be used to form a self aligned contact structure.

The first etch chemistry may be substantially different than the second etch chemistry. For example, after etching the first portion of the dielectric layer for a period of time, the gases supplied to the etch chamber may be changed from those producing the first etch chemistry to those producing the second etch chemistry. As such, gases of the first etch chemistry may be present in the etch chamber in negligible quantities after the etch chemistry is changed from the first etch chemistry to the second etch chemistry. In this manner, one etch process may be used to etch different portions of a single dielectric layer with multiple etch chemistries. For example, the first etch chemistry may be substantially free of hydrogen. However, a negligible amount of air may remain in an etch chamber subsequent to evacuating the etch chamber to a predetermined processing pressure such as approximately 10 mT to approximately 200 mT. The second etch chemistry may include at least one hydrogen-containing compound. In one embodiment, the first etch chemistry may include $C_4F_8$ and CO, and the second etch chemistry may include $C_2H_2F_4$, $CHF_3$ and other hydrofluorocarbon etchants. In addition, the first and second etch chemistries may include an inert gas such as argon and xenon. Furthermore, although all etch chemistries may be selective to a material to some degree, the first etch chemistry may have a substantially different etch selectivity than the second etch chemistry. In this manner, a material which may be used as an etch stop layer for etching with the first etch chemistry may not be used as an etch stop layer for etching with the second etch chemistry. In one embodiment, the first etch chemistry may be selective to silicon nitride while the second etch chemistry may be selective to undoped silicon dioxide. For example, the first etch chemistry may have a dielectric layer material:silicon nitride selectivity of at least approximately 10:1, and the second etch chemistry may have a dielectric layer material:silicon oxide selectivity of at least approximately 5:1. In addition, the second etch chemistry may also be selective to silicon nitride.

In an alternative embodiment, an entire thickness of the dielectric layer may be etched with the second etch chemistry. Because the second etch chemistry may be selective to undoped silicon dioxide, the second etch chemistry may etch the dielectric layer slower than the first etch chemistry. Increasing the dopant level in the dielectric layer may increase the etch rate of the dielectric layer during an etch process involving the second etch chemistry. As noted above, however, there may be disadvantages to increasing the dopant levels of dielectric materials in semiconductor devices. Therefore, the etch rate may be limited by a need to maintain acceptable dopant concentration in a dielectric layer in which contact openings may be formed. For example, an acceptable phosphorus concentration for PSG may be limited to less than approximately 6 wt. % to minimize phosphoric acid formation which may lead to aluminum corrosion. Likewise, to reduce the problems associated with using high concentration BPSG to form semiconductor devices, the level of boron in BPSO may be reduced to below approximately 5 wt. %.

In addition, etching the entire thickness of a dielectric layer with the second etch chemistry may result in a contact opening having unsatisfactory sidewall angles. Forming sidewalls of a contact opening which are perpendicular to the upper surface of a semiconductor substrate may involve using a substantially anisotropic etch chemistry. Such an anisotropic etch chemistry may etch lateral surfaces faster than vertical surfaces by forming a passivating layer of polymer on sidewalls of the etched structure. Etch chemistries which may be suitable for the second etch chemistry, however, may not necessarily include etch gases which are suitable for forming such a passivating layer of polymer. As such, contact openings which are formed with such an etch chemistry may have a sidewall angle which may deviate substantially from an angle which is perpendicular to the upper surface of a semiconductor substrate. Consequently, forming contact openings in this manner may result in contact structures which may have undesirable dimensions and electrical properties. Furthermore, etching an entire thickness of a dielectric layer with the second etch chemistry to form a high aspect ratio contact opening may be further complicated by the sidewall angle of the formed contact opening. For example, if the sidewall angle of the contact opening deviates substantially from 90°, the lateral dimensions of the contact opening at the top of the etched opening may be larger than an acceptable critical dimension before the entire contact opening may be etched. As such, the critical dimensions of a contact opening which may be formed by using only the second etch chemistry may be limited by the sidewall angle of the contact opening.

Subsequent to etching the second portion of the dielectric layer, an additional etch step may be performed to remove any residual dielectric material which may remain in the etched structure or to remove a native oxide which may have formed on the upper surface of the semiconductor substrate during prior processing or handling. In addition, the etch mask layer may be removed by using a wet etch or plasma etch stripping process. A layer of conductive material such as polysilicon, aluminum, or copper may then be formed in the etched structure and on the upper surface of the dielectric layer. As such, the etched structure may be completely filled with the layer of conductive material. The layer of conductive material may be planarized using a technique such as chemical mechanical polishing such that an upper surface of the conductive material within the etched structure may be substantially level with the upper surface of the dielectric layer. In this manner, a self aligned contact structure may be formed. Subsequent processing may include forming additional levels of semiconductor structures such as interconnects upon upper surfaces of the dielectric layer and the self aligned contact structures. Therefore, multiple levels of semiconductor structures may be interconnected to form a working semiconductor device.

Forming a self aligned contact structure by etching a single dielectric layer with multiple etch chemistries may provide several advantages over standard methods for forming self aligned contact structure. For example, a self aligned contact may be formed through a lightly doped or undoped dielectric layer stopping on a semiconductor layer which may include isolation regions such as undoped silicon dioxide without destroying the isolation regions. Because the first etch chemistry may not be selective to lightly doped or undoped silicon dioxide, the first etch chemistry maybe used to rapidly etch a first and larger portion of the dielectric layer. However, etching with the first etch chemistry may be stopped after a period of time has elapsed and before the entire dielectric layer has been removed such that the isolation regions may not be exposed. In this manner, a second portion of the dielectric layer may remain after etching with the first etch chemistry to protect the isolation regions. Furthermore, forming a self aligned contact structure through a lightly doped or undoped dielectric layer may have several advantages over standard, self aligned contact processes and structures because of the properties of a lightly doped or undoped dielectric material. For example, a lightly doped or undoped dielectric material may be substantially less hygroscopic and unstable than a heavily doped dielectric material.

In addition, the method may be used for forming a self aligned contact structure without shearing or destroying the gate structure. Shearing or destroying the gate structure may include, e.g., removing sufficient insulating material of the gate structure such that an electrical contact may be formed between a conductive material layer of the gate structure and the self aligned contact structure. For example, the gate structure may have a top insulating layer and a dielectric sidewall spacer. Etching the first portion of the dielectric layer may include etching the dielectric layer to a level such that an upper corner of the gate structure may be exposed. The upper corner of the gate structure may include an upper corner of the dielectric sidewall spacer and a portion of the top insulating layer. The top insulating layer and the dielectric sidewall spacer may be formed of a material such as silicontoxynitride or silicon nitride. Because the first etch chemistry may be selective to silicon nitride, the upper corner of the gate structure may be exposed during etching of the first portion of the dielectric layer without shearing or destroying the upper corner of the gate structure. In addition, the second etch chemistry may also be selective to silicon nitride such that the second portion of the dielectric layer may also be etched without shearing or destroying the upper corner of the gate structure. Therefore, by preventing shearing or destruction of the upper corner of the gate structure, shorting of the gate structure to the self aligned contact structure may be prevented.

In addition, by etching a first portion of the dielectric layer with the first etch chemistry, a contact opening may be formed which may have substantially perpendicular sidewall angles with respect to an upper surface of a semiconductor substrate. For example, the first etch chemistry may include $C_4F_8$ and CO which may promote the formation of a layer of a passivating polymer within the etched contact opening. Because etch processing conditions may be selected such that the etchant ions may reach the semiconductor substrate at a substantially perpendicular angle, the layer of passivating polymer may be sufficiently removed from lateral surfaces within the contact opening. In this manner, etching may not be prematurely stopped by polymer buildup within the contact opening. The sidewalls of the contact openings, however, may not be subjected to sufficient bombardment by the etchant ions such that the layer of polymer may be removed. The layer of polymer may serve to further protect the sidewalls of the contact opening from etchant ions which may be directed toward the sidewalls of the contact opening and which may cause the sidewall angle to deviate from a perpendicular angle. As such, using the first etch chemistry to etch a first and larger portion of the dielectric layer may provide a contact structure having substantially perpendicular sidewall angles. In this manner, the dimensions and the electrical properties may be substantially uniform across the contact structure.

Furthermore, by etching a first and larger portion of the dielectric layer with the first etch chemistry, a contact opening may be formed which may have a high aspect ratio. A high aspect ratio may describe a feature having a height which is substantially larger than its width when viewed in cross section. High aspect ratios may include aspect ratios which may be equal to or greater than approximately 4:1. In addition, high aspect ratios may be increasingly more common in advanced semiconductor devices due to the demand for increased device density on a semiconductor substrate. One of the problems associated with etching a high aspect ratio contact structure may include inadvertently forming a layer of passivating material within the contact opening such that etching may be prematurely stopped before the entire contact opening may be formed. For example, during an etch process, a layer of passivating material such as a polymeric residue or another by-product of the etch process may be formed on sidewall and bottom surfaces of a feature formed by the etch process. During etching of a high aspect ratio feature, more energetic ions of the etch plasma may strike sidewalls of the feature before reaching the bottom of the feature than during etching of a wider feature. In this manner, a passivating material layer which may be formed on the bottom surface of the feature may be insufficiently removed and may prematurely stop the etch process. By etching a first and larger portion of the dielectric layer with a substantially anisotropic etch chemistry such as the first etch chemistry, a layer of passivating material which may be formed in the bottom of the contact opening may be sufficiently removed during the etching process. As such, the entire high aspect ratio contact opening may be formed.

In addition, by etching a first and larger portion of the dielectric layer with the first etch chemistry, a self aligned contact structure may be formed which may have a minimum critical dimension. A critical dimension of a semiconductor feature such as a self aligned contact structure may be a width of the semiconductor feature when viewed in cross section. The dimensions of a self aligned contact structure may be larger above an upper surface of a gate structure formed laterally adjacent the contact structure than they are below the upper surface of the gate structure due to self alignment of the contact to the gate structure. Therefore, a self aligned contact structure may be characterized by a top critical dimension and a bottom critical dimension. Critical dimensions of semiconductor features such as self aligned contact structures are continually being decreased in order to increase the device density on a semiconductor substrate. Increased device density may result in benefits such as larger memory capability, faster operating speeds, and reduced production costs. For a high density semiconductor device, a critical dimension at the top or upper surface of a self aligned contact structure may be approximately 200 nm or less. In addition, a critical dimension at the bottom of the self aligned contact structure may be approximately 100 nm or less.

If an etch chemistry is used to etch a contact opening which may result in sidewalls which deviate from the perpendicular, a minimum critical dimension requirement at an upper surface of the contact opening may be exceeded before the entire contact opening may be etched. The first etch chemistry, however, may be highly anisotropic and may result in sidewalls which are substantially perpendicular. As such, a contact opening having a substantially uniform width across substantially the entire contact opening may be formed by using the first etch chemistry. In this manner, a first and larger portion of the dielectric layer may be etched before the dimensions of the contact structure at an upper surface of the opening may exceed a minimum critical dimension. Consequently, using the first etch chemistry to etch a first portion of the dielectric layer may result in self aligned contact structure having an acceptable critical dimension.

Additionally, by etching a second portion of the dielectric layer with the second etch chemistry, using a silicon nitride or silicon oxynitride liner layer as an etch stop layer may be eliminated. For example, the first etch chemistry may not be selective to lightly doped and undoped dielectric layers such as lightly doped PSG and undoped field oxide regions. Therefore, a silicon nitride or silicon oxynitride liner layer may be required as an etch stop if the entire dielectric layer is etched with the first etch chemistry. Using such an etch stop layer for forming a self aligned contact structure, however, may increase the number of steps in a manufacturing process, the manufacturing or cycle time, the overall cost of fabricating a semiconductor device, and increase the number of temperature cycles during processing and may decrease manufacturing capacity. Etching a lightly doped or undoped dielectric layer with the first etch chemistry, however, may provide an increased etch rate and may be used to form a self aligned contact structure having improved sidewall angle, increased aspect ratio and a minimum critical dimension.

In order to realize the benefits of using such an etch chemistry to form a contact opening in a lightly doped or undoped dielectric layer without having to form an additional etch stop layer, only a first portion of the dielectric layer may be etched with the first etch chemistry. For example, a second portion of the dielectric layer may protect underlying isolation regions during etching with the first etch chemistry. The second portion of the dielectric layer may then be etched with the second etch chemistry to form the contact opening. The second etch chemistry may be significantly more selective to lightly doped or undoped dielectric layers than the first etch chemistry. As such, the second etch chemistry may have a lower etch rate for etching lightly doped or undoped dielectric layers than the first etch chemistry. A thickness of the second portion of the dielectric layer, however, may be much smaller than a thickness of the first portion of the dielectric layer. As such, the second etch chemistry may be used to etch the second portion of the dielectric layer in order to protect the underlying isolation regions without significantly increasing the etch processing time. In addition, any increase in etch processing time which may result from a lower etch rate may be compensated for by eliminating a need for a silicon nitride or silicon oxynitride liner layer. For example, eliminating the silicon nitride or silicon oxynitride liner layer may significantly reduce overall processing time and complexity of a manufacturing process while a lower etch rate for only a portion of the contact opening may only negligibly increase the process time of a single manufacturing step. Consequently, a self aligned contact structure may be formed through a lightly doped or undoped dielectric layer to a semiconductor layer having isolation regions without forming a silicon nitride or silicon oxynitride liner layer.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
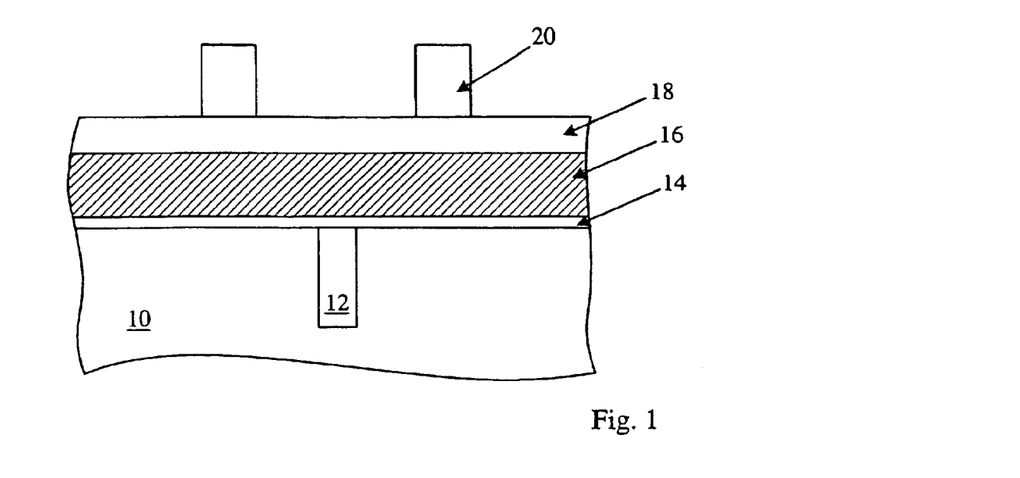
FIG. 1 depicts a partial cross-sectional view of a semiconductor topography in which a gate dielectric layer, a conductive material layer, and a top insulating layer are formed on a semiconductor layer and a layer of photoresist is patterned upon the top insulating layer.

Turning to the drawings, an exemplary embodiment of a method for forming a self aligned contact is shown in FIGS. 1–13. FIG. 1 depicts a semiconductor topography in which an isolation region 12 has been formed in semiconductor layer 10. Isolation region, 12 may be formed by a number of techniques such as shallow trench isolation (STI), recessed oxide isolation (ROI), or local oxidation of silicon (LOCOS). Isolation region 12 may be a field oxide region which may serve to isolate separate active regions on the semiconductor layer from one another. In addition, isolation region 12 may be undoped silicon dioxide. Semiconductor layer 10 may preferably be a silicon substrate, and is doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Diffusion regions (not shown) may also be formed in semiconductor layer 10. For example, diffusion regions may be lightly doped drain regions and heavily doped source/drain regions formed in the semiconductor layer adjacent to the gate structures as shown formed in FIG. 2.

As further shown in FIG. 1, gate dielectric layer 14 may preferably be thermally grown silicon dioxide which may be grown by heating the semiconductor layer 10 to a temperature of greater than about 700° C. in an oxidizing ambient such as $O_2$ or $H_2O$. Gate dielectric layer 14 may also include deposited $SiO_2$. Other dielectrics may be used, however, including silicon nitride, silicon oxynitride or nitrided silicon dioxide. In addition, gate dielectric layer 14 may be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$).

A layer of conductive material 16 such as polysilicon, aluminum, or copper may be deposited upon the gate dielectric layer 14. For example, polysilicon may be deposited by using chemical vapor deposition (CVD) of silicon from a silane source. In addition, the layer of conductive material 16 may include multiple layers of material such as a conventionally doped polysilicon and a silicide. A silicide may be formed from a polysilicon layer upon which a layer of refractory metal such as cobalt or titanium has been formed. Upon heating the refractory metal, a reaction between the polysilicon and the cobalt or titanium may result in the formation of a silicide such as cobalt silicide or titanium silicide. Alternatively, the layer of conductive material may include a titanium-tungsten alloy layered onto bulk aluminum with an underlying barrier layer such as titanium, titanium nitride, or a titanium alloy. A thickness of the layer of conductive material may be approximately 1500 Å but may also be larger or smaller depending on the semiconductor device which is being formed.

In addition, as shown in FIG. 1, top insulating layer 18 may include deposited silicon nitride, silicon oxynitride, or nitrided silicon dioxide which may be formed using, e.g., a chemical vapor deposition process. For example, silicon nitride or silicon oxynitride may be formed by CVD using a silicon source, such as silane, chlorosilane ($SiH_xCl_y$), or dichlorosilane ($SiCl_2H_2$), and a nitrogen source, such as nitrogen ($N_2$), nitrous oxide ($N_2O$) and ammonia ($NH_3$). Deposition of silicon nitride may be performed at a substrate temperature in the range of about 600° C. to about 950° C., a deposition chamber pressure of approximately 5 mT to approximately 500 mT, and for a period of time of approximately 20 minutes to approximately 100 minutes. In addition, top insulating layer 18 may be silicon dioxide deposited by CVD which may be nitrided in a subsequent processing step. In particular, decomposition of tetraethyl orthosilicate (TEOS) may be performed in a plasma-enhanced CVD (PECVD) reactor at a substrate temperature in the range from about 200° C. to about 500° C. to produce a very conformal film. Other techniques which may be used to deposit silicon dioxide for top insulating layer 18 include PECVD using a silane source, and atmospheric-pressure CVD (APCVD) and low-pressure CVD (LPCVD) using silane or TEOS sources. In addition, top insulating layer 18 may be formed from a low-permittivity ("low-k") dielectric, generally known in the art as a dielectric having a dielectric constant of less than about 3.5. One low-k dielectric in current use which is believed to make a conformal film is fluorine-doped silicon dioxide. An appropriate thickness of top insulating layer 18 may be approximately 500 Å to approximately 2500 Å. An appropriate thickness of top insulating layer 18 may, however, be larger or smaller depending on the semiconductor device which is being formed.

Figure 2:
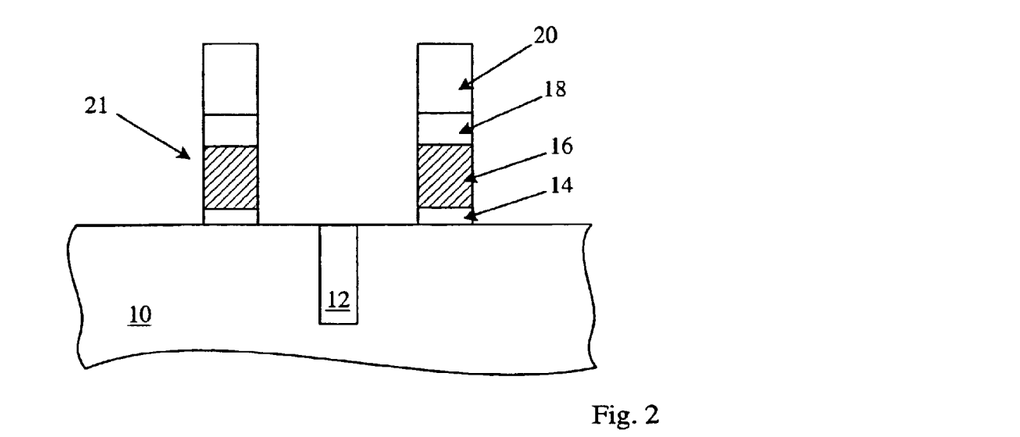
FIG. 2 depicts a partial cross-sectional view of a semiconductor topography in which gate conductor stacks are formed on a semiconductor layer.

A layer of photoresist 20 may be patterned, typically by a lithography technique, upon top insulating layer 18 thereby exposing portions of top insulating layer 18. As shown in FIG. 2, exposed portions of top insulating layer 18, conductive material layer 16, and gate dielectric layer may be patterned, typically by etch techniques, such that gate structures 21 may be formed. Although two gate structures are illustrated, any number of gate structures may,be formed upon and laterally spaced across semiconductor layer 10. A width of gate structures may be approximately 1500 Å, but may also be larger or smaller depending on the semiconductor device which is being formed. In addition, exposed portions of top insulating layer 18, conductive material layer 16, and gate dielectric layer may be patterned by a suitable technique to form local interconnect structures 21. Furthermore, portions of the top insulating layer, the conductive material layer, and gate dielectric layer may be selectively patterned such that both gate structures and local interconnect structures are formed across semiconductor layer 10. In this manner, the arrangement of gate structures and/or local interconnect structures across the semiconductor layer may depend on the semiconductor device which is being formed.

Figure 3:
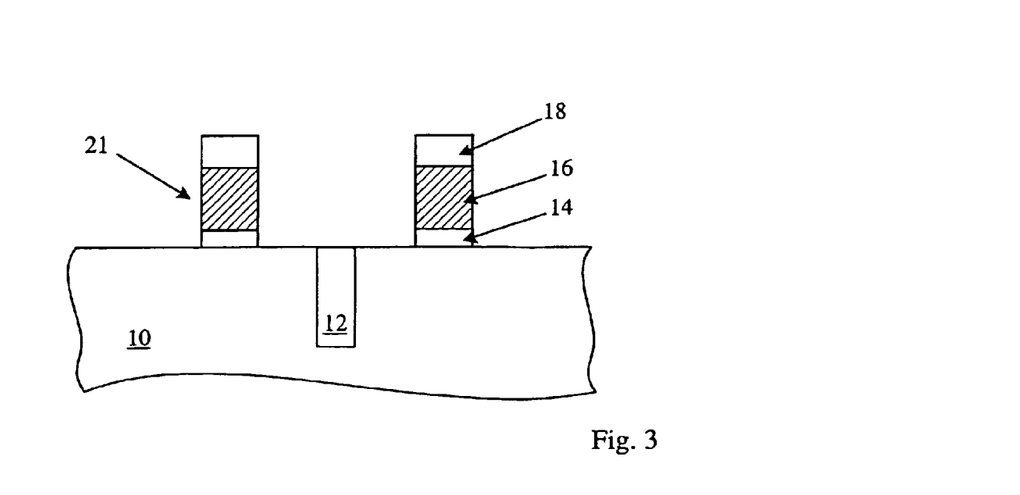
FIG. 3 depicts a partial cross-sectional view of a semiconductor topography in which the patterned layer of photoresist is removed from the gate conductor stacks.

Preferably, a plasma etch may be used to remove portions of the top insulating layer, the conductive material layer, and the gate dielectric layer which are not masked by photoresist layer 20 to form gate structures 21. In such an embodiment, the plasma etch duration may be selected to terminate before substantial portions of semiconductor layer 10 and isolation region 12 are removed. As a result of the etch, substantially vertical opposed sidewall surfaces may be defined as the lateral boundaries of gate structures 21. As shown in FIG. 3, photoresist layer 20 may be stripped from gate structures 21. For example, photoresist layer 20 may be removed from gate structures 21 by using a wet etch or plasma etch stripping process.

Figure 4:
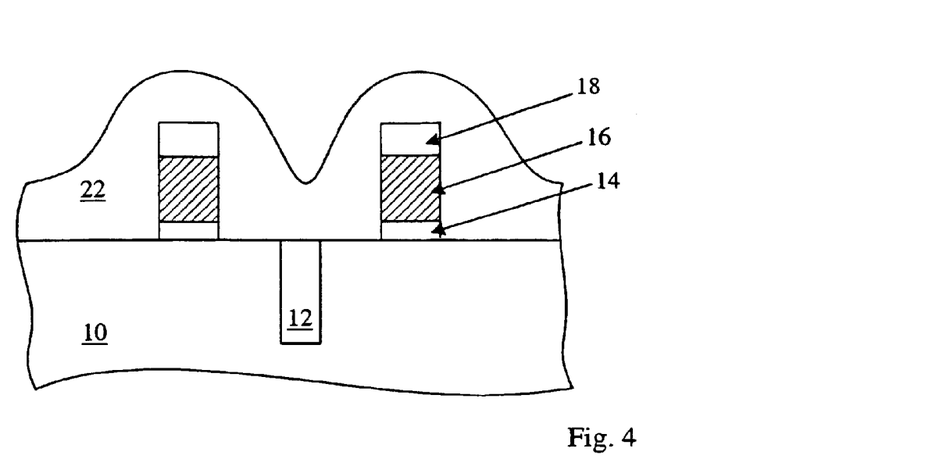
FIG. 4 depicts a partial cross-sectional view of a semiconductor topography in which a layer of dielectric material is formed over the semiconductor topography.

Turning to FIG. 4, a layer of a conformal dielectric layer 22 may be deposited over the entire semiconductor topography including gate structures 21 and semiconductor layer 10. Dielectric layer 22 may preferably deposited by CVD using a silane source. In particular, plasma-enhanced CVD (PECVD) may be used to deposit a very conformal film at substrate temperatures between about 200° C. and 400° C. Other techniques which may be suitable for deposition of dielectric layer 22 include low-pressure CVD (LPCVD) and atmospheric pressure (CVD) (APCVD). Dielectric layer 22 may also be silicon oxynitride, silicon dioxide, or nitrided silicon oxide as described above for top insulating layer 18. For example, silicon oxynitride, silicon dioxide, and nitrided silicon oxide may be formed by CVD as described above. In an alternative embodiment, dielectric layer 22 may be formed from a low-permittivity ("low-k") dielectric, generally known in the art as a dielectric having a dielectric constant of less than about 3.5.

Figure 5:
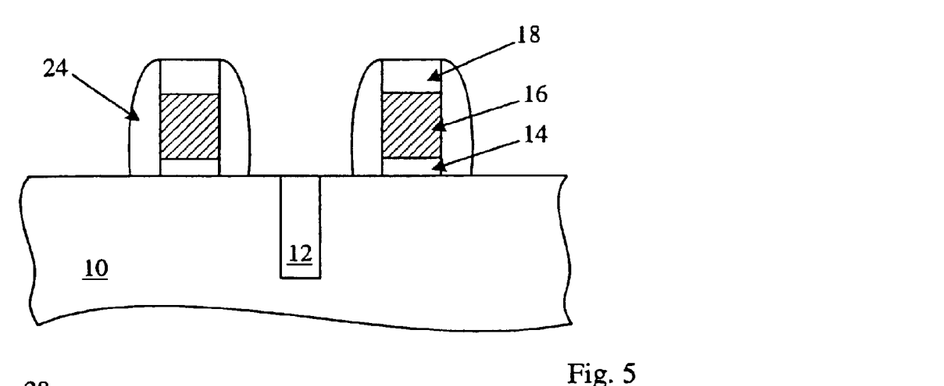
FIG. 5 depicts a partial cross-sectional view of a semiconductor topography in which dielectric sidewall spacers are formed on the sidewall surfaces of the gate conductor stacks to form gate structures.

FIG. 5 illustrates dielectric sidewall spacers 24 formed upon sidewall surfaces of gate structures 21. The formation of dielectric sidewall spacers 24 may involve anisotropically etching the horizontally oriented surfaces of dielectric layer 22 at a faster rate than vertically oriented surfaces. As a result of the etch process, the dielectric layer 22 may only be retained laterally adjacent sidewall surfaces of gate structures 21 in the form of dielectric sidewall spacers 24. A lateral thickness of dielectric sidewall spacers 24 may be approximately 300 Å to approximately 1000 Å, but may also be larger or smaller depending on the semiconductor device which is being formed. The lateral thickness of each sidewall spacer 24 may be controlled by altering the processing conditions, such as deposition time, during the deposition of dielectric layer 22.

Figure 6:
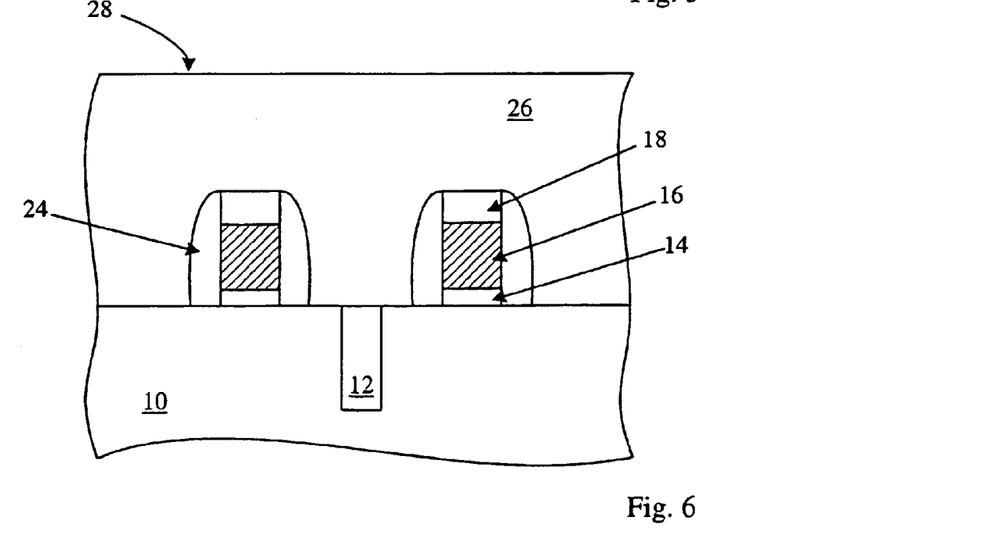
FIG. 6 depicts a partial cross-sectional view of a semiconductor topography in which a dielectric layer is formed upon the gate structures and the semiconductor layer.

FIG. 6 illustrates dielectric layer 26 formed upon and in contact with the entire semiconductor topography which may include dielectric sidewall spacers 24 of gate structures 21 and semiconductor layer 10. Dielectric layer 26 may be formed from, e.g., low doped BPSG, low doped PSG, or undoped silicon dioxide. Low doped BPSG may have a boron concentration of less than approximately 5% by weight. Low doped PSG may have a phosphorus concentration of less than approximately 6% by weight, and more preferably less than approximately 5% by weight. In an embodiment, dielectric layer 26 may be deposited by a high density plasma (HDP) deposition technique. A high density plasma may include a charge density that generally exceeds that used in conventional plasma enhanced and plasma assisted chemical vapor deposition (PECVD and PACVD). For example, a high density plasma may include a charge density that exceeds that which may be used to deposit conventional PECVD BPSG layers such as charge densities which may generally exceed approximately $10^7$ charged particles per $cm^3$.

In addition, a high density plasma may have a low frequency power in a range of approximately 4000 W to approximately 4500 W, and a high frequency power in a range of approximately 1200 W to approximately 1500 W. Furthermore, a HDP PSG layer may be formed from a plasma which may include a mixture of a silicon source such as silane or a chlorosilane, an oxygen source such as oxygen, ozone, or nitrous oxide, and a phosphorus source such as phosphine, methyl phosphine, or ethyl phosphine. For example, a silicon source may flow into a plasma chamber at a rate of approximately 5 to 100 standard cubic centimeters per minute (sccm). An oxygen source may flow into the plasma chamber at a rate of approximately 20 sccm to approximately 1000 sccm, and a phosphorus source may flow into the plasma chamber at a rate of approximately 10 sccm to approximately 500 sccm. In addition, argon may also flow into the plasma chamber at a rate of approximately 25 sccm to approximately 40 sccm. The flow ratios of the silicon and phosphorus sources may be selected in a range from approximately 1:20 to approximately 1:2. Following deposition, dielectric layer 26 may be planarized to a level spaced above gate structure 21 to provide a substantially planar upper surface 28 of dielectric layer 26. Appropriate thicknesses for dielectric layer 26 may be approximately 5000 Å to approximately 11000 Å, and more preferably may be approximately 8000 Å to approximately 9500 Å. Larger or smaller thicknesses of dielectric layer 26, however, may be appropriate depending on the semiconductor device being formed.

Figure 7:
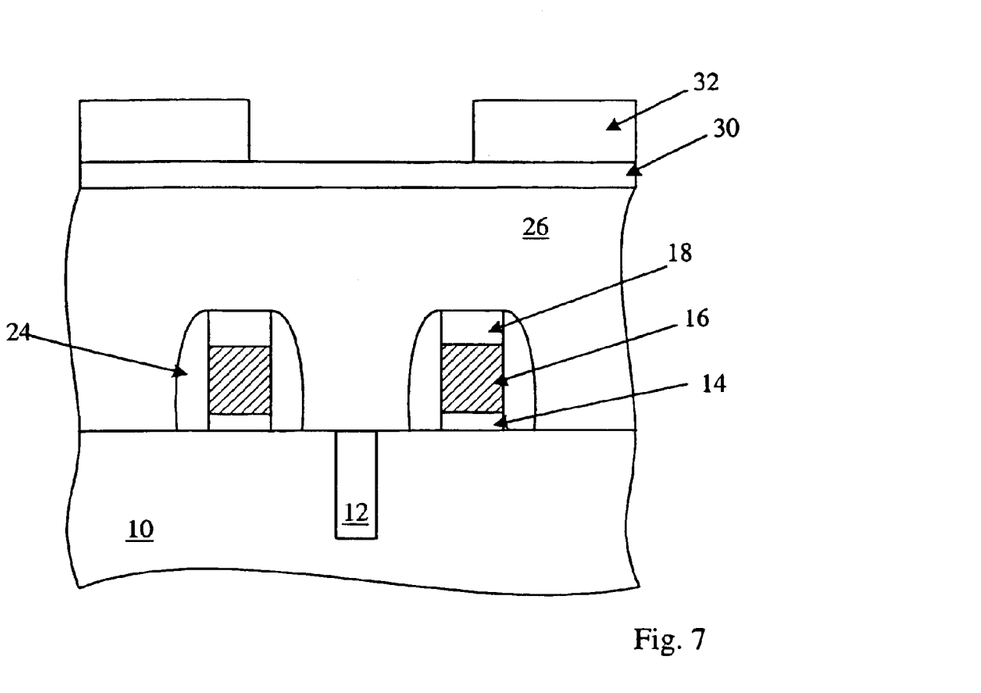
FIG. 7 depicts a partial cross-sectional view of a semiconductor topography in which a hard mask layer is formed upon the dielectric layer and a layer of photoresist is patterned upon the hard mask layer.

FIG. 7 illustrates hard mask layer 30 formed on dielectric layer 26. Hard mask layer 30 may be an undoped silicon dioxide layer if dielectric layer 26 is lightly doped of heavily doped dielectric material. In this manner, hard mask layer 30 may prevent outdiffusion from dielectric layer 26 during subsequent thermal processes and/or may prevent moisture from migrating into dielectric layer 26. Hard mask layer 30 may also provide a more stable surface for subsequent layers which may be formed upon the semiconductor topography. Hard mask layer 30 may be formed by decomposition of tetraethyl orthosilicate (TEOS) which may be performed in a plasma-enhanced CVD (PECVD) reactor at a substrate temperature in the range from about 200° C. to about 500° C. to produce a very conformal film. Other techniques which may be used to deposit silicon dioxide for dielectric layer 22 include PECVD using a silane source, and atmospheric-pressure CVD (APCVD) and low-pressure CVD (LPCVD) using silane or TEOS sources.

Figure 8:
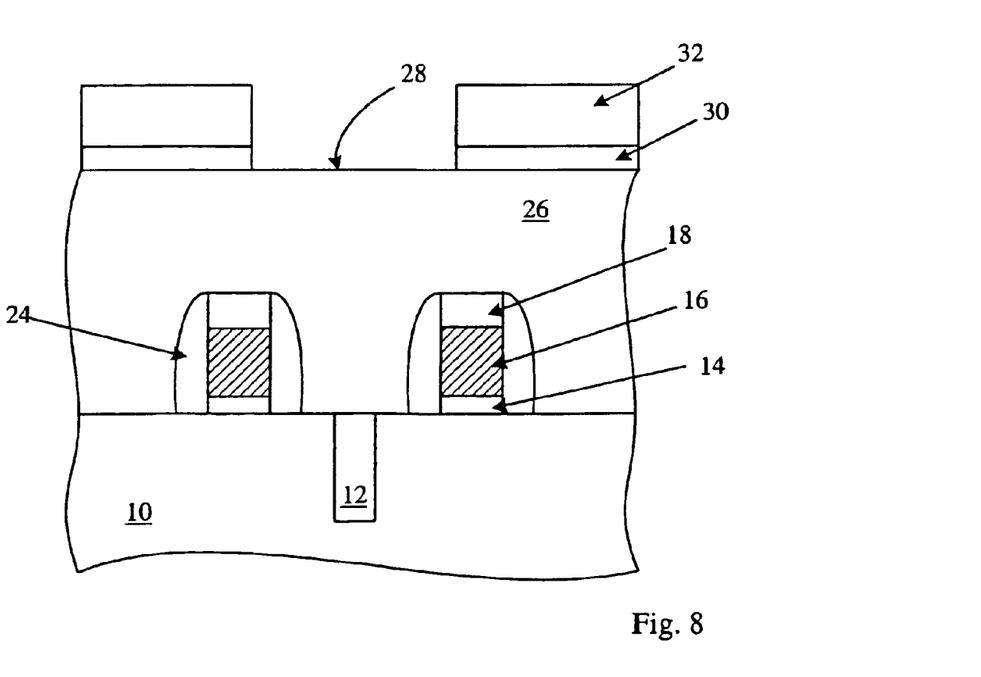
FIG. 8 depicts a partial cross-sectional view of a semiconductor topography in which exposed portions of the hard mask layer are removed.
Figure 9:
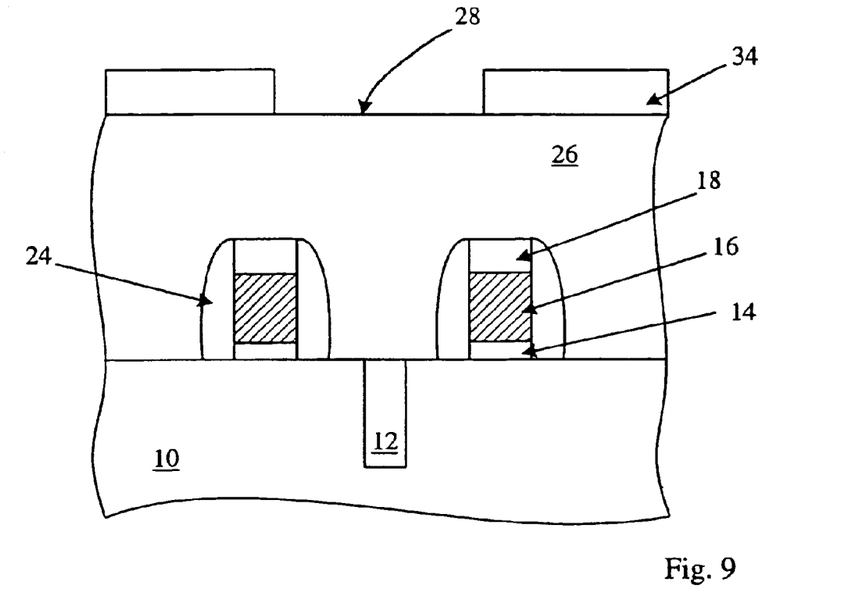
FIG. 9 depicts a partial cross-sectional view of a semiconductor topography in which an etch mask layer is formed upon the dielectric layer.

As further shown in FIG. 7, a layer of photoresist 32 may be formed upon hard mask layer 30 and may be patterned by using a lithography technique. The patterned layer of photoresist 32 may be used as an etch mask such that portions of hard mask layer 30 may be removed by using an etch technique as shown in FIG. 8. In this manner, portions of hard mask layer 30 underlying the patterned layer of photoresist may be protected. As such, a pattern formed by lithography in the layer of photoresist may be transferred by etch to hard mask layer 30. Consequently upper surface 28 of dielectric layer 26 may be exposed for subsequent processing. Subsequent to patterning hard mask layer 30, the patterned layer of photoresist may be removing by using a stripping process such as a wet etch or reactive ion etch stripping process. Therefore, hard mask layer 30 may be used an as etch mask layer in subsequent pattern transfer processes such as reactive ion etching or plasma etching. Alternatively, the patterned layer of photoresist may remain following etching of hard mask layer 30 as shown in FIG. 8. In addition, hard mask layer 30 may be eliminated, and the layer of photoresist 32 may be formed and patterned upon dielectric layer 26. In this manner, the patterned hard mask layer, the patterned layer of photoresist, or the combination of the patterned layer of photoresist and the patterned hard mask layer may be used as an etch mask layer in subsequent processing. As shown in FIG. 9, the patterned hard mask layer, the patterned resist layer, or the combination of the patterned layer of photoresist and the patterned hard mask layer may be generically referred to as etch mask layer 34.

Figure 10:
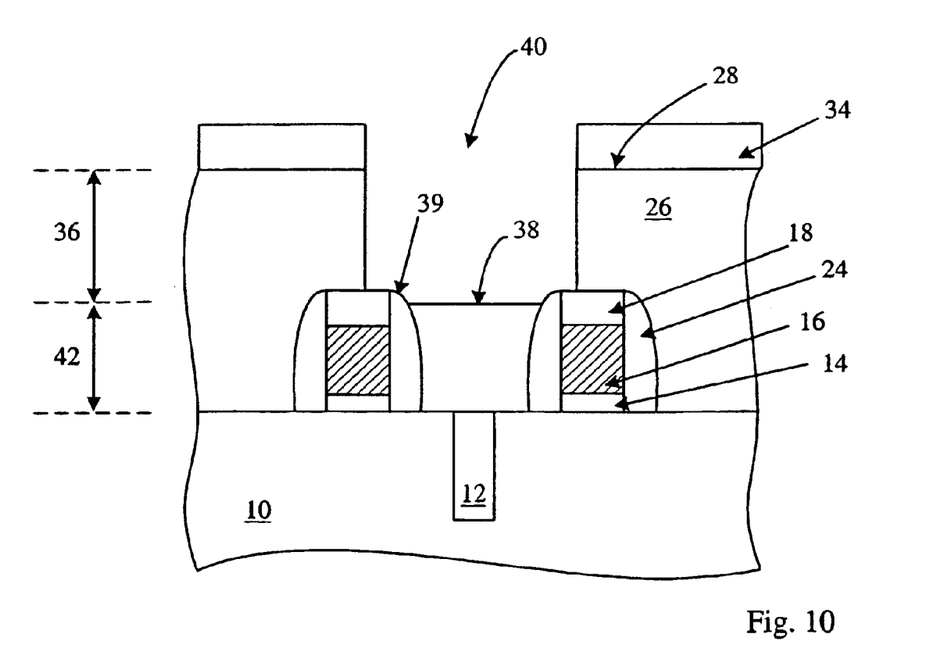
FIG. 10 depicts a partial cross-sectional view of a semiconductor topography in which a first portion of the dielectric layer is etched.

FIG. 10 illustrates the formation of opening 40 in dielectric layer 26 in regions of the dielectric layer which are not protected by etch mask layer 34. Opening 40 may be formed by etching a first portion of dielectric layer 26 with a first etch chemistry such that upper surface 38 of dielectric layer 26 is exposed. The first etch chemistry may be substantially free of hydrogen. For example, the first etch chemistry may include fluorocarbons such as $C_4F_8CO$. In addition, the first etch chemistry may include an inert gas such as argon or xenon. Furthermore, the first etch chemistry may include a number of additional fluorinated carbon compounds and/or chlorinated carbon compounds such as $CFCl_3$, $CF_2Cl_2$, $CF_3Cl$, $CF_4$, $C_2F_6$, and $C_2ClF_5$.

The first etch chemistry may be selective to silicon nitride. For example, the first etch chemistry may etch silicon nitride at a very slow etch rate and may etch other dielectric materials such as lightly doped PSG or undoped silicon dioxide at a very fast etch rate. For example, the first chemistry may have an etch rate of lightly doped PSG or undoped silicon dioxide of approximately 3500 Å/min to approximately 4500 Å/min, and more preferably approximately 4000 Å/min. A selectivity of an etch chemistry or an etch process may be generally defined as the ratio of the etch rates of different materials. As such, the etch selectivity for an etch chemistry may vary significantly depending on the materials which are being etched. For example, the first etch chemistry may have a undoped silicon dioxide to silicon nitride etch selectivity of at least approximately 10:1. In addition, the first etch chemistry may also have a lightly doped PSG to undoped silicon dioxide etch selectivity of approximately 1:1. As such, the first etch chemistry may be selective to silicon nitride but not to undoped silicon dioxide.

An etch process may be defined by a number of process conditions. In an embodiment, for example, a flow rate for $C_4F_8$ may be approximately 10 sccm to approximately 100 sccm, and more preferably may be approximately 10 sccm to approximately 40 sccm. In addition, a flow rate for CO may be approximately 10 sccm to approximately 100 sccm, and more preferably may be approximately 25 sccm to approximately 55 sccm. A flow rate for argon or xenon may be approximately 5 sccm to approximately 300 sccm. Furthermore, a flow rate for oxygen may be approximately 1 sccm to approximately 50 sccm. Radio frequency power values for etching the first portion of the dielectric layer may be approximately 500 W to approximately 2000 W. A pressure in the etch chamber may be approximately 30 mT to approximately 200 mT during processing. Additionally, a magnetic field within the etch chamber may be approximately 10 G to approximately 100 G. In addition, a temperature within the etch chamber may be approximately 50° C. to approximately 130° C. As such, this temperature may be approximately the temperature of the semiconductor substrate which is being etched. The semiconductor substrate may be situated on an electrostatic chuck within the etch chamber during processing. The chuck may be cooled by flowing helium across a surface of the chuck at a pressure in a range of approximately 1 T to approximately 50 T. As such, the temperature of the semiconductor substrate which is being etched may be altered by adjusting the pressure of helium which is flowing across the surface of the chuck.

Furthermore, etching the first portion of dielectric layer 26 may be a timed etch process. For example, etching with the first etch chemistry may be carried out for a period of time of approximately one minute to approximately two minutes, and more preferably approximately one and a half minutes. In this manner, depending on the etch rate of dielectric layer 26, a predictable amount of the dielectric layer may be removed by etching with the first etch chemistry. For example, thickness 36 of dielectric layer 26 may be removed by etching the first portion of the dielectric layer with the first etch chemistry. In one embodiment, thickness 36 of dielectric layer 26 may be approximately 2000 Å to approximately 12000 Å, and more preferably may be approximately 4000 Å to approximately 8000 Å. As shown in FIG. 10, dielectric layer 26 may be etched from prior upper surface 28 of the dielectric layer to upper surface 38 of a second portion of dielectric layer. As such, etching dielectric layer 26 with the first etch chemistry may be timed such that a second portion of the dielectric layer may remain after this etch step. As shown in FIG. 10, a second portion of dielectric layer 26 may extend from upper surface 38 of the dielectric layer formed by etching with the first chemistry to an upper surface of semiconductor layer 10. Thickness 42 of the second portion of dielectric layer 26 may be sufficient to protect semiconductor layer 10 including isolation region 12 from etching during the first etch step. In an embodiment, thickness 42 of the second portion of dielectric layer 26 may be approximately 1000 Å to approximately 5000 Å, and more preferably may be approximately 1000 Å to approximately 3000 Å.

In addition, etching the first portion of the dielectric layer with the first etch chemistry may expose upper corner 39 of the gate structures. For example, upper corner 39 of the gate structures may include an upper corner of dielectric sidewall spacers 24 and a portion of top insulating layer 18. However, because the first etch chemistry may be selective to silicon nitride, exposing the upper corner of the dielectric sidewalls spacers and a portion of the top insulating layer may not cause damage to these exposed dielectric structures. In this manner, the layer of conductive material 16 of gate structures 21 may not be exposed during etching with the first etch chemistry. As such, an electrical contact between the gate structures and a contact structure which may be formed in the etched contact opening may be avoided and electrical shorting between the structures may be prevented.

Figure 11:
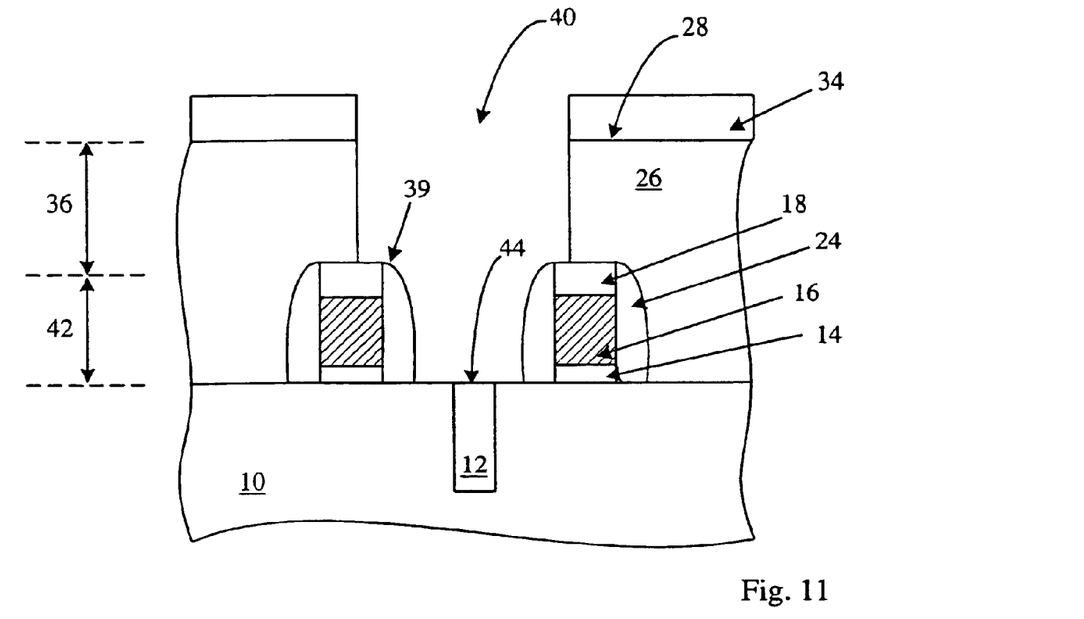
FIG. 11 depicts a partial cross-sectional view of a semiconductor topography in which a second portion of the dielectric layer is etched to form a contact opening.

FIG. 11 illustrates the formation of opening 40 in dielectric layer 26 in regions of the dielectric layer which are not protected by etch mask layer 34. Opening 40 may be formed by etching a second portion of dielectric layer 26 with a second etch chemistry such that upper surface 44 of semiconductor layer 10 may be exposed. As shown in FIG. 10, a second portion of dielectric layer 26 may extend from upper surface 38 of the dielectric layer formed by etching with the first chemistry (as shown in FIG. 10) to upper surface 44 of semiconductor layer 10. The second etch chemistry may include at least one hydrogen-containing compound. For example, the second etch chemistry may include hydrofluorocarbons such as $C_2H_2F_4$ and $CNF_3$. In addition, the second etch chemistry may include an inert gas such as argon or xenon. Furthermore, the second etch chemistry may include a number of additional fluorinated carbon compounds and/or chlorinated carbon compounds such as $CFCl_3$, $CF_2Cl_2$, $CF_3Cl$, $CF_4$, $C_2F_6$, and $C_2ClF_5$.

The second etch chemistry may be selective to undoped silicone dioxide. In addition, the second etch chemistry may also be selective silicon nitride. For example, the second etch chemistry may etch silicon nitride and undoped silicon dioxide at a slow etch rate and may etch other dielectric materials such as lightly doped PSG at a fast etch rate. For example, the second chemistry may have an etch rate of lightly doped PSG of approximately 3000 Å/min to approximately 4000 Å/min, and more preferably approximately 3500 Å/min. As described above, a selectivity of an etch chemistry or an etch process may be generally defined as the ratio of the etch rates of different materials. As such, the etch selectivity for an etch chemistry may vary significantly depending on the materials which are being etched. For example, the second etch chemistry may also have a lightly doped PSG to undoped silicon dioxide etch selectivity of approximately 30:1. In addition, the second etch chemistry may have a lightly doped PSG to silicon nitride etch selectivity of approximately 5:1 to approximately 20:1.

An etch process may be defined by a number of process conditions. In an embodiment, for example, a flow rate for $C_2H_2F_4$ may be approximately 1 sccm to approximately 20 sccm, and more preferably may be approximately 2 sccm to approximately 15 sccm. In addition, a flow rate for $CHF_3$ may be approximately 5 sccm to approximately 200 sccm, and more preferably may be approximately 50 sccm to approximately 100 sccm. A flow rate for argon or xenon may be approximately 5 sccm to approximately 500 sccm. Radio frequency power values for etching the first portion of the dielectric layer may be approximately 200 W to approximately 2000 W. Additional processing conditions for etching with the second etch chemistry may be similar to those described above for etching with the first etch chemistry such as pressure, magnetic field, temperature, and helium pressure. The processing conditions for etching with the second etch chemistry, however, may also vary from the processing conditions which may be used for etching with the first etch chemistry. For example, the processing conditions may be changed by controlling instruments which may be coupled to the etch chamber while the etch chemistry is being changed from the first etch chemistry to the second etch chemistry.

Etching the second portion of dielectric layer 26 may also be a timed etch process. For example, etching with the second etch chemistry may be carried out for a period of time of approximately one half minute to approximately two minutes, and more preferably approximately one minute. In this manner, depending on the etch rate of dielectric layer 26, a predictable amount of the dielectric layer such as thickness 42 of the dielectric layer may be removed by etching with the second etch chemistry. In an embodiment, thickness 42 may be approximately 1000 Å to approximately 5000 Å, and more preferably may be approximately 2000 Å to approximately 4000 Å. Alternatively, etching the second portion of dielectric layer 26 may be an endpoint process. Examples of techniques which may be used for endpoint detection may include, but are not limited to, laser interferometry and reflectivity, optical emission spectroscopy, and mass spectroscopy. An endpoint may be detected when a layer being etched has been completely removed. For example, as shown in FIG. 11, dielectric layer 26 may be etched with the second etch chemistry from upper surface 38 of the dielectric layer to upper surface 44 of semiconductor layer 10. Therefore, an endpoint may be detected when dielectric layer 26 has been completely removed in contact opening 40 such that an upper surface 44 of semiconductor layer 10 may be exposed. As such, a height of contact opening 40 may be approximately equal to thickness 36 of the first portion of dielectric layer 26 and thickness 42 of the second portion of dielectric layer 26. For example, a height of contact opening 40 may be approximately 4000 Å to approximately 12000 Å, and more preferably may be approximately 5000 Å to approximately 9000 Å.

In addition, during etching the second portion of dielectric layer 26 with the second etch chemistry, upper corner 39 of the gate structures which may include an upper corner of dielectric sidewall spacers 24 and a portion of top insulating layer 18 may be exposed. However, because the second etch chemistry may be selective to silicon nitride, exposing the upper corner of the dielectric sidewall spacers and a portion of the top insulating layer during etching may not cause damage to these exposed dielectric layers. In this manner, the layer of conductive material 16 of the gate structures may not be exposed during the etching process. As such, an electrical contact between the gate structures and a contact structure which may be formed in etched contact opening 40 may be avoided and electrical shorting between the structures may be prevented. Once the contact opening 40 is made by etching the first and second portions of dielectric layer 26, etch mask layer 34 may be removed by a wet etch or plasma etch stripping process. In addition, the opening may be cleaned with a sputter etch such as a RF sputter etch before conductive material may be formed in contact opening 40. In this manner, any residual material remaining on upper surface 44 of semiconductor layer 10 such as a native oxide which may be formed during processing and handling may be removed to ensure electrical contact between semiconductor layer 10 and a contact structure which may be formed in contact opening 40.

Figure 12:
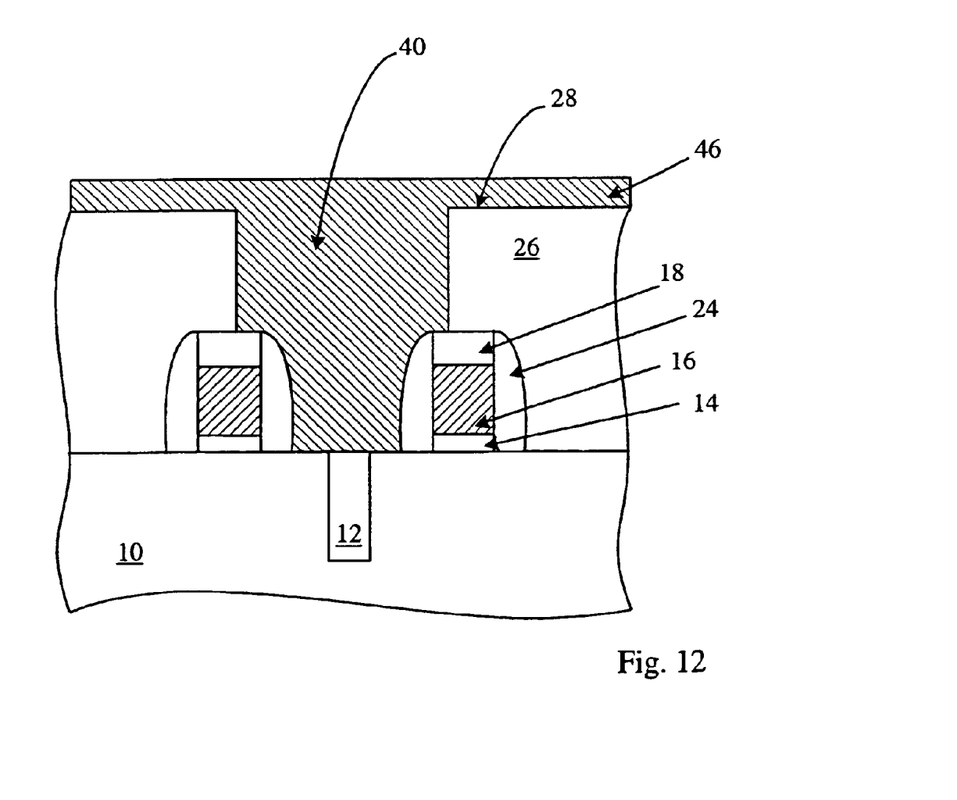
FIG. 12 depicts a partial cross-sectional view of a semiconductor topography in which a layer of conductive material is formed in the contact opening and upon an upper surface of the dielectric layer.

FIG. 12 illustrates formation of conductive material layer 46 in contact opening 40 and upon upper surface 28 of dielectric layer 26. Conductive material layer 46 may be formed with a single deposition step in which a conductive material such as aluminum, tungsten, titanium, or appropriate alloys thereof are deposited into contact opening 40. For example, a CVD process may be used to deposit aluminum by the pyrolysis of triisobutyl aluminum (TIBA) in a reactor chamber maintained at a temperature of approximately 250° C. and a pressure less than approximately 1 torr. In addition, conductive material layer 46 may be deposited using a technique such as atmospheric pressure chemical vapor deposition (APCVD), low pressure chemical vapor deposition (LPCVD), plasma-enhanced chemical vapor deposition (PECVD), conventional sputtering, and physical vapor deposition (PVD).

Furthermore, conductive material layer 46 may be copper formed in contact opening 40 and upon upper surface 28 of dielectric layer 26. Because copper diffuses readily through silicon and oxide, and undesirably alters the electrical properties of transistors formed in silicon, a liner maybe deposited into the trenches before deposition of a copper layer. A liner may preferably be formed from a conductive material which acts as a diffusion barrier to the overlying copper, and also adheres well to dielectric layer 26. Materials typically used as a liner, which is often called a diffusion barrier and/or an adhesion layer, may include metal nitrides such as titanium nitride and tantalum nitride, and refractory alloys such as titanium-tungsten. Conductive material layer 46 may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing the copper fill layer, but other techniques, including CVD, may be used as well.

An adhesion layer (not shown) may also be formed in contact opening 40 and on upper surface 28 of dielectric layer 26 prior to formation of conductive material layer 46. For example, an adhesion layer may be formed by blanket depositing an adhesion material onto the sidewalls and bottom of contact opening 40. Suitable adhesion materials include titanium (Ti), titanium-tungsten (TiW), titanium nitride (TiN), or tungsten suicides ($WSi_x$). Adhesion layers are typically required in those cases where conductive material layer 46 may adhere poorly to the material of dielectric layer 26. Adhesion layers are typically required, for example, to compensate for the poor adhesion characteristics of tungsten and some tungsten alloys to silicon dioxide dielectric films. After an adhesion layer has been formed, a conductive material layer may then be deposited on the adhesion layer as described above.

Figure 13:
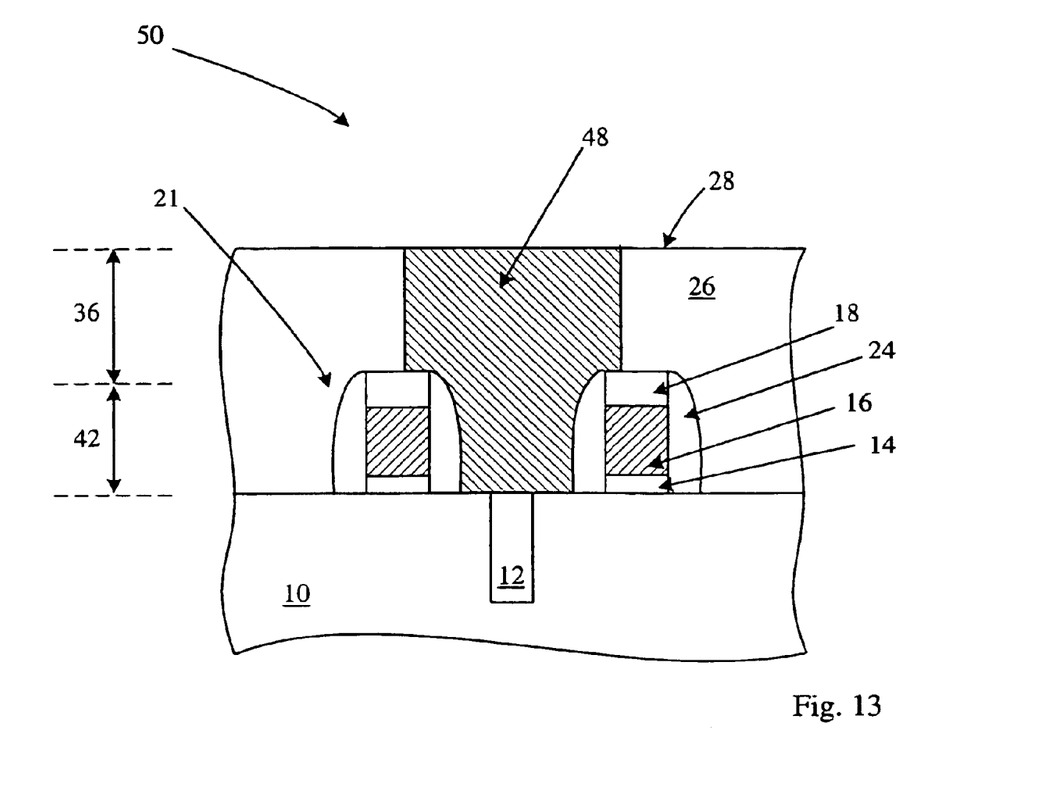
FIG. 13 depicts a partial cross-sectional view of a semiconductor topography in which the layer of conductive material is planarized to form a self aligned contact structure.

FIG. 13 illustrates self aligned contact structure 48 formed through dielectric layers 26 and in contact with an upper surface of semiconductor layer 10. A selective-etch-back process may be used to remove conductive material layer 46 from upper-surfaces 28 of dielectric layer 26. Alternatively or in addition, a chemical-mechanical polishing process may be used to remove conductive material layer 46 from upper surfaces 28 of dielectric layer 26. In this manner, an upper surface of conductive material layer 46 may be substantially coplanar with upper surface 28 of dielectric layer 26. In addition, if an adhesion layer is used to promote adhesion between conductive material layer 46 and dielectric layer 26, then the adhesion layer may be removed from upper surface 28 of dielectric layer 26 by using etch or polishing technique. Subsequent processing may include forming additional levels of semiconductor structures such as interconnects upon upper surfaces of the dielectric layer and the self aligned contact structures. Therefore, multiple levels of semiconductor structures may be interconnected to form a working semiconductor device.

FIG. 13 also illustrates a semiconductor device 50 which may be formed according to an above embodiment. A layer of conductive material 16 is spaced above a semiconductor layer 10 by gate dielectric layer 14. Top insulating layer 18 may be formed upon the conductive material layer 16. As such, gate structures 21 may include top insulating layer 18, conductive material layer 16, and gate dielectric layer 14. Gate structures 21 may be laterally surrounded by dielectric sidewall spacers 24 formed adjacent to opposed sidewalls of gate structures 21. Isolation region 12 may be formed in semiconductor layer 10. In addition, diffusion regions (not shown) may be formed in semiconductor layer 10 and may extend laterally between gate structures 21. Dielectric layer 26 may be formed over and in contact with gate structures 21 and semiconductor layer 10. Self aligned contact structure 48 may be formed in dielectric layer 26. As such, self aligned contact structure 48 may be in electrical contact with semiconductor layer 10 and may also be in electrical contact with a diffusion region formed in semiconductor layer 10.

According to an embodiment, self aligned contact structure 48 of semiconductor device 50 may have substantially perpendicular sidewalls, i.e. approximately a 90° sidewall angle with respect to semiconductor layer 10, across first portion 36 of self aligned contact structure 48. Across second portion 42, self aligned contact structure 48 may have sidewall angles which are defined by outside lateral boundaries of dielectric sidewall spacers 24. In addition, self aligned contact structure 48 may also have a high aspect ratio of greater than approximately 4:1 and minimum critical dimensions such as a top critical dimension of approximately 200 nm and a bottom critical dimension of approximately 100 nm. Furthermore, semiconductor device 50 may be absent an etch stop liner layer such as a silicon nitride liner layer over gate structures 21 and dielectric sidewall spacers 24 which may be present in conventionally formed semiconductor devices.

It will be appreciated to those skilled in the art having the benefit of this disclosure that this invention is believed to provide a method for forming a self aligned contact structure by etching a single dielectric layer with multiple etch chemistries. Further modifications and alternative embodiments of various aspects of the invention will be apparent to those skilled in the art in view of this description. For example, the methods described herein could be applied not just to forming self aligned contacts, but to forming any semiconductor feature which may include etching a feature through a material having an etch response which is similar to an etch response of an underlying semiconductor layer. For example, the method described herein may be used in a dual damascene process in which an interconnect and a contact structure may be formed simultaneously in a dielectric layer. It is intended that the following claims be interpreted to embrace all such modifications and changes and, accordingly, the specification and drawings are to be regarded in an illustrative rather than a restrictive sense.

What is claimed is:

1. A method for forming a semiconductor device, comprising:
    etching a first portion of a dielectric layer formed on a semiconductor topography with a first etch chemistry, wherein the first etch chemistry is substantially free of hydrogen and comprises $C_4F_8$;
    etching a second portion of the dielectric layer with a second etch chemistry different from the first etch chemistry, wherein the first and second etch chemistries etch are selective to silicon nitride, wherein the second etch chemistry has a dielectric material silicon oxide selectivity of at least approximately 5:1, and wherein the dielectric layer comprises the dielectric material; and
    changing gases supplied to an etch chamber comprising the semiconductor topography between the steps of etching from those producing the first etch chemistry to those producing the second etch chemistry such that gases of the first etch chemistry are present in negligible quantities during the step of etching the second portion of the dielectric layer.

2. The method of claim 1, wherein the dielectric layer is substantially continuous.

3. The method of claim 1, wherein an interface does not exist between the first and second portions of the dielectric layer.

4. The method of claim 1, wherein a thickness of the first portion of the dielectric layer is greater than a thickness of the second portion of the dielectric layer.

5. The method of claim 1, wherein the semiconductor topography comprises a gate structure formed on a semiconductor layer, and wherein a thickness of the second portion of the dielectric layer is greater than approximately one half of a height of the gate structure.

6. The method of claim 1, wherein the first etch chemistry further comprises CO.

7. The method of claim 1, wherein the second etch chemistry comprises at least one hydrogen-containing compound.

8. The method of claim 1, wherein he second etch chemistry comprises $C_2H_2F_4$.

9. The method of claim 1, wherein the second etch chemistry comprises $CHF_3$.

10. The method of claim 1, further comprising forming said dielectric layer on said semiconductor topography in one processing step.

11. The method of claim 1, wherein the first etch chemistry has a dielectric material:silicon nitride selectivity of at least approximately 10:1, and wherein the dielectric layer comprises the dielectric material.

12. The method of claim 1, wherein the dielectric layer comprises a doped silicon oxide having a phosphorus concentration of less than approximately 6 wt. %.

13. The method of claim 1, wherein the semiconductor topography comprises a gate structure formed on a semiconductor layer, wherein the semiconductor layer comprises isolation regions, and wherein the dielectric layer is in contact with a sidewall spacer of the gate structure and the semiconductor layer.

14. The method of claim 13, wherein etching the first portion of the dielectric layer exposes an upper corner of the sidewall spacer, and wherein etching the second portion of the dielectric layer exposes the semiconductor layer.

15. The method of claim 1, wherein the step of etching the first portion of the dielectric layer comprises etching the first portion at a rate between approximately 3500 angstroms per minute and approximately 4500 angstroms per minute.

16. The method of claim 1, wherein the step or etching the second portion of the dielectric layer comprises etching the second portion at a rate between approximately 3000 angstroms per minute and approximately 4000 angstroms per minute.

* * * * *

UNITED STATES PATENT AND TRADEMARK OFFICE
CERTIFICATE OF CORRECTION

PATENT NO. : 6,803,318 B1
DATED : October 12, 2004
INVENTOR(S) : Qiao et al.

It is certified that error appears in the above-identified patent and that said Letters Patent is hereby corrected as shown below:

Column 21,
Lines 57-58, please delete "chemistries etch are" and substitute therefor
-- chemistries are --.
Line 59, please delete "material silicon" and substitute therefor -- material:silicon --.

Column 22,
Line 27, please delete "he second" and substitute therefor -- the second --.
Line 56, please delete "step or" and substitute therefor -- step of --.

Signed and Sealed this

First Day of February, 2005

JON W. DUDAS
*Director of the United States Patent and Trademark Office*